United States Patent [19]

Kupfer

[11] Patent Number: 4,573,211
[45] Date of Patent: Feb. 25, 1986

[54] TWO-CIRCUIT RESONANT BANDPASS FILTER FOR TELEVISION TUNERS

[75] Inventor: Karl H. Kupfer, Krefeld, Fed. Rep. of Germany

[73] Assignee: U.S. Philips Corporation, New York, N.Y.

[21] Appl. No.: 481,537

[22] Filed: Apr. 4, 1983

[30] Foreign Application Priority Data

Apr. 6, 1982 [DE] Fed. Rep. of Germany ....... 3212731

[51] Int. Cl.[4] ............................................. H03J 5/00
[52] U.S. Cl. .................................. 455/188; 455/180; 455/333; 334/60; 334/56; 334/47
[58] Field of Search ...................... 334/47, 55, 56, 59, 334/60, 15, 71; 455/188, 191, 333, 180, 197

[56] References Cited

U.S. PATENT DOCUMENTS

| | | | |
|---|---|---|---|
| 3,493,870 | 2/1970 | Kupfer | 455/333 X |
| 4,247,953 | 1/1981 | Shinagawa et al. | 455/191 |
| 4,408,348 | 10/1983 | Theriault | 455/188 X |
| 4,418,427 | 11/1983 | Muterspaugh | 455/188 X |

*Primary Examiner*—Eugene R. Laroche
*Assistant Examiner*—Benny T. Lee
*Attorney, Agent, or Firm*—Thomas A. Briody; William J. Streeter; Edward W. Goodman

[57] ABSTRACT

The invention relates to a two-circuit resonant bandpass filter for television tuners for switching a first frequency band to a second frequency band. The bandpass filter has a common primary circuit to which two secondary circuits are coupled, a first of the secondary circuits being connected via an electronic switch to the primary circuit which, together with the reactances of the first secondary circuit, short circuits, in the closed condition, the second secondary circuit.

4 Claims, 1 Drawing Figure

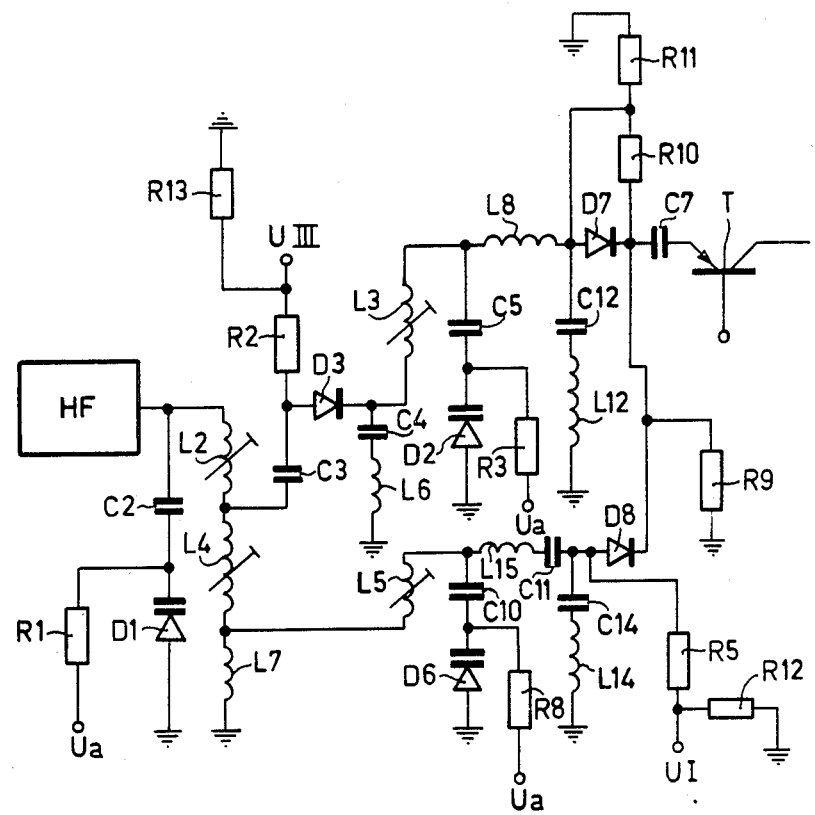

TWO-CIRCUIT RESONANT BANDPASS FILTER FOR TELEVISION TUNERS

BACKGROUND OF THE INVENTION

The invention relates to a two circuit resonant bandpass filter for television tuners comprising electronic switches for switching the filter from a first frequency band to a second frequency band.

Such a filter is disclosed in the periodical "IEEE-Trans. CE-22", No. 3, August 1976, pages 203–209, more specifically FIGS. 2 and 3. The prior art bandpass filter is arranged in a tuner between the RF-input stage and a mixer stage. Both the RF-input stage and the mixer stage comprise field effect transistors which do not substantially load the input and the output of the filter. Consequently, the attenuation of the filter is determined by the rather poor quality of the coils and capacitors or capacitance diodes, respectively, used in the filter, as well as by the non-zero forward resistance of the two switching diodes which are used as electronic switches. The primary circuit and the secondary circuit are then damped substantially equally.

Field effect transistors, when used in mixer stages, are, however, comparatively expensive, significantly reduce the frequency swing owing to the parallel arrangement of the gate capacitance (approximately 3 pF) and the resonant circuit capacitance (approximately 4 pF) and, for adequate mixing, require a comparatively large amplitude of the oscillator signals. If, however, a bipolar transistor in a grounded base circuit is used as the mixer stage, then the secondary side of the bandpass filter is subjected to a considerably greater load and, more specifically so, when a coil is arranged between the filter output and the mixer stage input for decoupling purposes. Added to this is the fact that for an optimum decoupling or matching, respectively, the inductance of this coil must have a different value in the higher frequency band than in the lower frequency band. If the coil is divided into two coil sections and if one coil section for the higher frequency band is short-circuited by means of an electronic switch-usually a switching diode-, then the unavoidable capacitance of the electronic switch acts in the lower frequency band in parallel with the coil, which may result in deviations in the frequency variation.

The disadvantages described in the foregoing are particularly noticeable in what are commonly referred to as S-band tuners, that is to say tuners for special channels, of the type which are indispensable for, for example, cable television equipment. The VHF-range I then extends from 48.25 to approximately 108 MHz and the VHF-range III extends from approximately 109 MHz to approximately 300 MHz.

In a known S-band tuner (see Valvo Handbuch "Fernsehtuner, Verzögerungsleitungen" 1978, pages 121–126), a bipolar mixing transistor, which operates in the grounded-base mode, is therefore connected to two RF-input stages via an individual switching diode for each stage, a complete bandpass filter having two circuits for the lower and the upper frequency band, respectively, being arranged between the output of each of the two RF-input stages and the input of the mixer transistor. In contrast to the prior art tuner described in the opening paragraph, the bandpass filter is substantially not attenuated by the switching diodes. The known tuner has, however, the drawback that the number of components is substantially doubled.

SUMMARY OF THE INVENTION

The invention has for its object to provide a two-circuit bandpass filter of the above-mentioned type for two frequency ranges, more specifically the VHF-ranges I and III, of such a construction with a small number of components that the attenuation of the bandpass filter over the overall frequency range is preferably reduced at the low-frequency end of the upper frequency range.

According to the invention, this object is accomplished in that two secondary circuit are coupled to the primary circuit, that the two secondary circuits are each coupled to the mixing stage via an electronic switch and that the primary circuit is connected to the secondary circuit for the higher frequency band via another electronic switch which is arranged such that in the closed state, it substantially short-circuits the input of the second secondary circuit via reactances which are low-ohmic for the lower frequency band and, in the open state, separates the secondary circuit for the higher frequency band from the primary circuit.

DESCRIPTION OF THE DRAWING

The invention will now be further described by way of example with reference to the accompanying drawing which, for the VHF ranges I and III shows the S-band tuner portion which is essential for the invention.

DESCRIPTION OF THE PREFERRED EMBODIMENT

The primary circuit of a bandpass filter, the two frequency bands having this circuit in common, is connected to the highly resistive output of an RF-input stage HF. The primary circuit is formed by the parallel arrangement of a capacitive branch and an inductive branch. The capacitive branch comprises a 4.7 nF capacitor C2 connected to the output of the RF-input stage HF and connected to ground via a capacitance diode D1 of the type BB 109. The inductive branch is formed by the series arrangement of three coils L2, L4 and L7, which-in this sequence-are arranged between the output of the RF-input stage HF and ground. The coil L2, which has a value of approximately 40 nH, is adjustable as is also the coil L4, which has a value of approximately 190 nH.

The coil L7, one terminal of which is connected to ground, provides the coupling inductance of the bandpass filter consisting of two circuits for the VHF-range I whose secondary circuit comprises as an inductance a (adjustable) coil L5 arranged between the junction of the coils L4 and L7 and the series arrangement of a capacitor C10 and a capacitance diode D6, the second terminal of which is connected to ground. The capacitance of the capacitance diode D6 can be varied by means of a tuning voltage Ua which is applied to it in the reverse direction and via the 15 kOhm resistor R8, and the capacitance of the capacitance diode D1 can be varied by means of the tuning voltage Ua applied to it via a 39 kOhm resistor R1. The secondary circuit is connected, via a series arrangement of a coupling coil L15 of 220 nH and a 10 nF isolating capacitor C11, to a switching diode D8 whose cathode is connected to a capacitor C7, the other terminal of which is connected to the emitter of the mixer transistor T.

The bias voltage for the base and the emitter of this transistor T is produced by a voltage divider, not shown, while the collector is connected to ground via the IF-output circuit, not shown. The junction of the cathode of the switching diode D8 and the capacitor C7 is connected to ground via a 1 kOhm resistor R9. The switching diode D8 is rendered conductive by a switching voltage UI, this switching voltage being applied to its anode via a resistor R5 and being discharged to ground via a 22 kOhm resistor R12. The junction of the coil L15 and switching diode D8 is connected to ground via a series resonant circuit provided by an inductance L14 of approximately 125 nH and a 150 pF capacitance C14, and is tuned to the intermediate frequency (36.5 MHz).

The junction of the two coils L2, L4 of the primary circuit is connected to the anode of a switching diode D3 via a 10 nF isolating capacitor C3. The cathode of the switching diode D3 is connected to a 7 nH coil L6 via a 10 nF isolating capacitor C4, this coil L6 being used as a coupling coil for the VHF-band III. In addition, the cathode of the diode D3 is connected to the secondary circuit for the VHF-band III, the circuit comprising an adjustable coil L3 of 60 nH, arranged between the diode D3 and the series arrangement of the 1.8 nF capacitor C5 and a capacitance diode D2 of the type BB 109, the second terminal of which is connected to ground and whose capacitance can also be varied by means of the tuning voltage Ua which is applied to it via the resistor R3. The secondary circuit is connected via the 100 nH coil L8 to the anode of a diode D7 whose cathode is connected to the capacitor C7. The junction of the coil L8 and the diode D7 is connected to ground via a series resonant circuit provided by the coil L12, having an inductance of approximately 55 nH, and a 330 pF capacitor C12 and is tuned to the intermediate frequency. A 22 kOhm resistor R10 is arranged in parallel with the diode D7 and a resistor R11 of the same value connects the anode of the diode D7 to ground.

The coils L2 and L3 can be adjusted such that at the same frequency in the VHF-band III the primary circuit and the secondary circuit are in resonance. Also the coils L4 and L5 are adjusted such that the primary circuit and the other secondary circuit are each in resonance at the same frequency in the VHF-band I.

The switching diodes D3 and D7 can be made conductive by means of a switching voltage U III applied to the anode of the diode D3 via a 3.9 kOhm resistor R2 and discharged to ground via a 22 kOhm resistor R13; the switching current then flows via the diode D3, the coils L3 and L8 and switching diodes D7 and the resistor R9 to ground. In the situation in which the VHF-band III is received, the primary circuit portion provided by the coils L4 and L7 is substantially short-circuited for the VHF-frequencies in band I via the capacitor C3, the diode D3, the capacitor C4 and the coupling coil L6. The diode D8 is cut-off by the voltage generated at the resistor R9 by the switching current. The coil L8 has for its object to match the input of the mixer stage to the secondary circuit of the filter. The series resonant circuit L12, C12 suppresses the intermediate frequency at the emitter of the transistor.

For the reception of signals from the VHF-band I, the switching voltage U III is switched off and the switching voltage U I is switched on, as a result of which the diode D8 conducts and the diodes D7 and D3 are cut-off in response to the voltage drop across R9. The coil L15 and the series resonant circuit L14, C14 have the same function as the coil L8 and the series resonant circuit L12, C12, respectively, but they have an inductance which is matched to the VHF-band I and a characteristic resistance matched thereto, respectively.

If the bandpass filter is operated in the VHF-band III (D3 and D7 conductive, D8 non-conductive) then the primary circuit is damped by the diode D3 and the secondary circuit is only damped by the input of the mixer stage T. Consequently, this damping is less than when the bandpass filter disclosed in "IEEE Transactions on Consumer Electronics", August 1976, were arranged between the RF-input stage and the mixer stage T. The damping reduction is accompanied by an improvement in the selectivity. Changes in the frequency variation do not occur, as each secondary circuit and the associated coupling coils and also the IF-series resonant circuit can be dimensioned optimally for the relevant frequency range.

The number of additional components is very small when the fact is taken account of that also when the prior art bandpass filter is used two coupling coils and two IF series resonant circuits must be provided, of which each time one coil or one circuit, respectively would have to be short circuited by means of an additional switching diode. Only one additional capacitance diode and the associated isolating capacitor are then namely required.

What is claimed is:

1. A two-cricuit resonant bandpass filter for television tuners having electronic switches for switching the filter from a lower frequency band to a higher frequency band, characterized in that said bandpass filter comprises a primary partial filter section and a first and a second secondary partial filter section each coupled to said primary partial filter section, a mixing stage being coupled to said first and second secondary partial filter section via respective electronic switches, and a further electronic switch being arranged between said primary partial filter section and said second secondary partial filter section so that when said further electronic switch is closed, the coupling between said primary partial filter section and said first secondary partial filter section is substantially short-circuited via reactances which are low-ohmic for said lower frequency band and, when said further electronic switch is opened, the second secondary partial filter section is separated from said primary partial filter section.

2. A bandpass filter as claimed in claim 1, characterized in that the primary partial filter section comprises a coil having two branches, the branch at which the higher signal frequency is present is connected via the further electronic switch to a shunt coupling inductance for the higher frequency band, and that a coil section arranged between the other branch and ground provides in the primary partial filter section a shunt coupling inductance for the lower frequency band.

3. A bandpass filter as claimed in claim 1 or 2, in which a bipolar transistor, operating in the grounded-base mode serves as the mixer stage, characterized in that an input of the mixer stage, comprising an emitter of said transistor, is connected to said respective electronic switches which are each connected to a respective one of the secondary partial filter sections via a respective series-arranged coil.

4. A circuit arrangement as claimed in claim 3, characterized in that at least one of the junctions of the two series arranged coils and the respective electronic switches is connected to ground via a series resonant circuit tuned to the intermediate frequency.

* * * * *